United States Patent
Dang et al.

(10) Patent No.: US 9,537,199 B2
(45) Date of Patent: *Jan. 3, 2017

(54) PACKAGE STRUCTURE HAVING AN INTEGRATED WAVEGUIDE CONFIGURED TO COMMUNICATE BETWEEN FIRST AND SECOND INTEGRATED CIRCUIT CHIPS

(71) Applicant: International Business Machines Corporation, Armonk, NY (US)

(72) Inventors: Bing Dang, Chappaqua, NY (US); Duixian Liu, Scarsdale, NY (US); Jean-Olivier Plouchart, New York, NY (US); Alberto Valdes-Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/662,610

(22) Filed: Mar. 19, 2015

(65) Prior Publication Data

US 2016/0276727 A1  Sep. 22, 2016

(51) Int. Cl.
  *H01P 5/107* (2006.01)
  *H01P 5/02* (2006.01)
  *H01P 3/16* (2006.01)
  *H01P 3/12* (2006.01)

(52) U.S. Cl.
  CPC .............. *H01P 5/107* (2013.01); *H01P 3/121* (2013.01); *H01P 3/16* (2013.01); *H01P 5/02* (2013.01)

(58) Field of Classification Search
  CPC .................................. H01P 5/107; H01P 3/12
  USPC ..................................................... 333/26, 248
  See application file for complete search history.

(56) References Cited

U.S. PATENT DOCUMENTS

| | | |
|---|---|---|
| 5,528,074 A | 6/1996 | Goto et al. |
| 6,175,287 B1 | 1/2001 | Lampen et al. |
| 6,356,173 B1 | 3/2002 | Nagata et al. |
| 6,967,347 B2 | 11/2005 | Estes et al. |
| 7,809,329 B2 | 10/2010 | Rofougaran |
| 8,032,089 B2 | 10/2011 | Rofougaran |
| 8,688,153 B2 | 4/2014 | Komori |
| 2011/0018657 A1* | 1/2011 | Cheng et al. ........... H01P 3/121 333/239 |

(Continued)

OTHER PUBLICATIONS

T. Larocca et al., "A 64QAM 94GHz CMOS Transmitter SoC with Digitally-Assisted Power Amplifiers and Thru-Silicon Waveguide Power Combiners," IEEE Radio Frequency Integrated Circuits Symposium, Jun. 2014, pp. 295-298.

*Primary Examiner* — Benny Lee
(74) *Attorney, Agent, or Firm* — Vazken Alexanian; Ryan, Mason & Lewis, LLP

(57) ABSTRACT

Embodiments include package structures having integrated waveguides to enable high data rate communication between package components. For example, a package structure includes a package substrate having an integrated waveguide, and first and second integrated circuit chips mounted to the package substrate. The first integrated circuit chip is coupled to the integrated waveguide using a first transmission line to waveguide transition, and the second integrated circuit chip is coupled to the integrated waveguide using a second transmission line to waveguide transition. The first and second integrated circuit chips are configured to communicate by transmitting signals using the integrated waveguide within the package carrier.

15 Claims, 11 Drawing Sheets

(56) References Cited

U.S. PATENT DOCUMENTS

2012/0068891 A1     3/2012  Haroun et al.
2012/0242421 A1*    9/2012  Robin et al. ............ H01P 5/107
                                                              333/26
2013/0265733 A1    10/2013  Herbsommer et al.

* cited by examiner

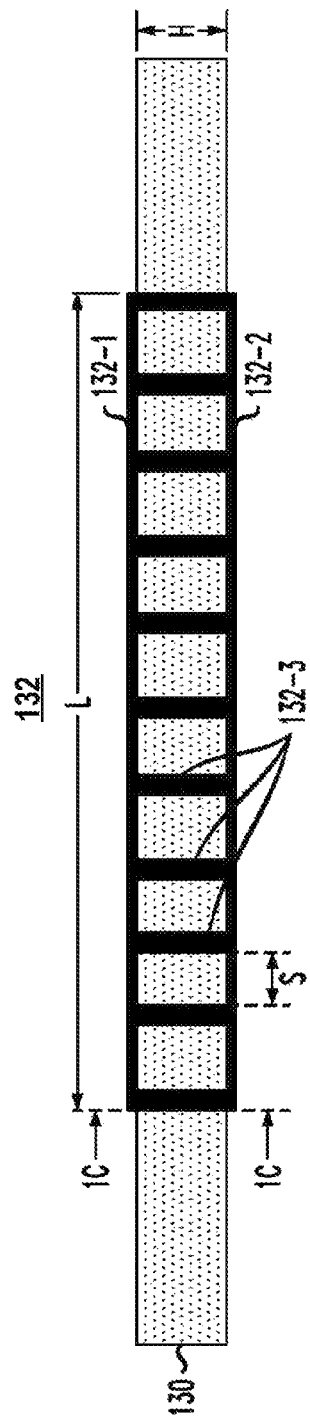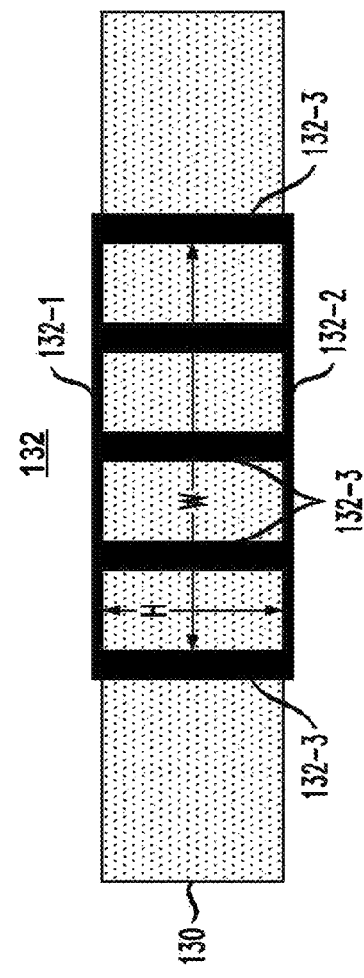

200

300

500

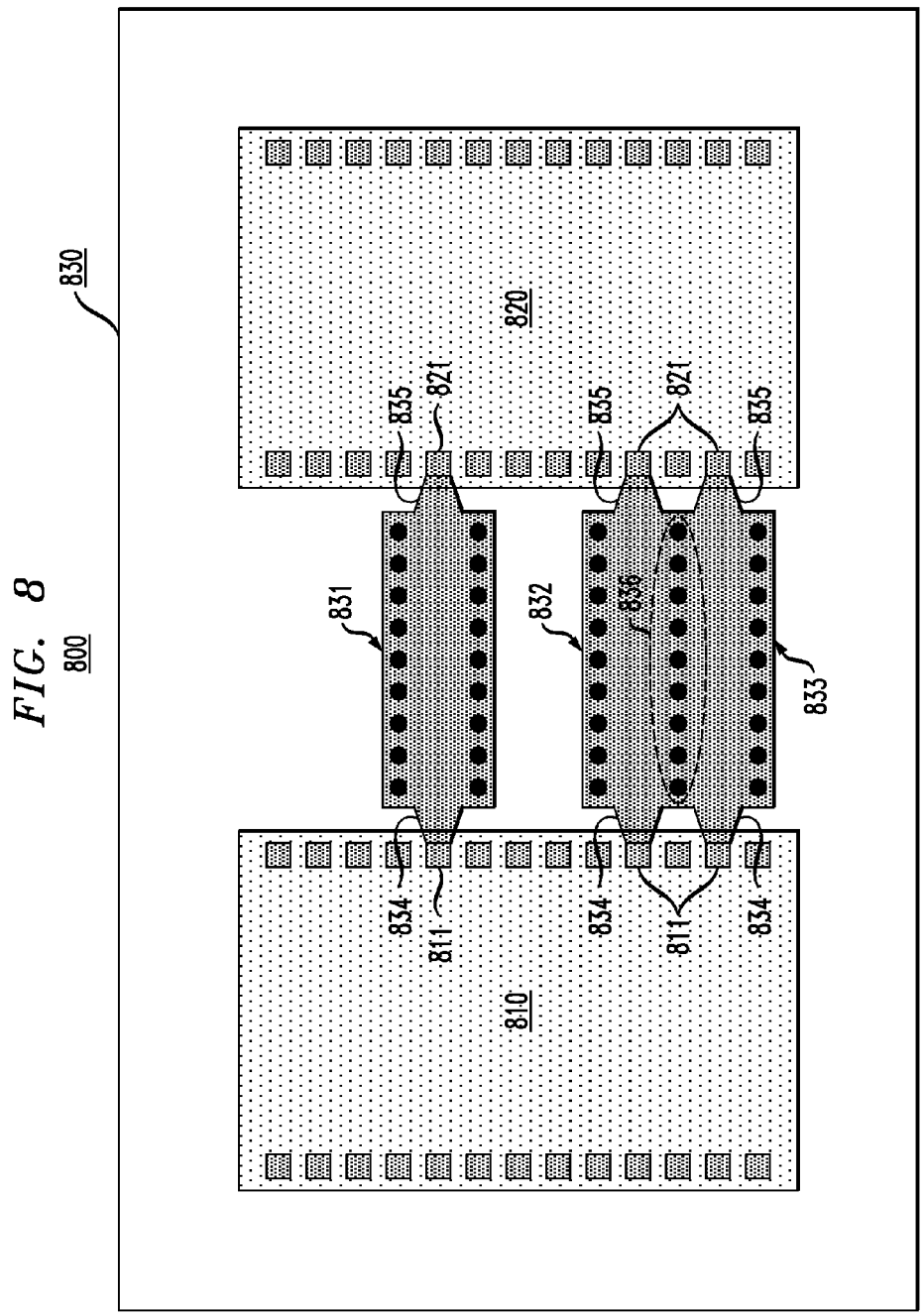

PACKAGE STRUCTURE HAVING AN INTEGRATED WAVEGUIDE CONFIGURED TO COMMUNICATE BETWEEN FIRST AND SECOND INTEGRATED CIRCUIT CHIPS

TECHNICAL FIELD

This disclosure generally relates to package structures and, in particular, to techniques for enabling communication between package components.

BACKGROUND

When constructing multi-chip package structures, it is important to implement interconnect structures that enable communication between package components such as integrated circuit (IC) chips. Conventional structures for transmitting signals between package components include, for example, planar transmission lines such as microstrip, stripline, and coplanar waveguides transmission lines. While these transmission lines are sufficient for transmitting lower frequency signals, signal attenuation and frequency dispersion occurs when using such planar transmission lines to transmit high frequency signals that are demanded by today's industry standards. Indeed, the ability to implement high-speed communication links in package structures that are capable of transmitting at data rates in the range of Gbps (Gigabits per second) to hundreds of Gbps will be essential for various types of systems designed to operate at millimeter-wave frequencies to Terahertz frequencies, such as radar, imaging, and computer server systems.

SUMMARY

Embodiments of the invention include package structures having integrated waveguides to enable high data rate communication between package components. In one embodiment of the invention, a package structure includes a package substrate having an integrated waveguide, and first and second integrated circuit chips mounted to the package substrate. The first integrated circuit chip is coupled to the integrated waveguide using a first transmission line to waveguide transition, and the second integrated circuit chip is coupled to the integrated waveguide using a second transmission line to waveguide transition. The first and second integrated circuit chips are configured to communicate by transmitting signals using the integrated waveguide within the package carrier.

Another embodiment of the invention includes a semiconductor wafer having a bulk substrate layer, an active silicon layer, a BEOL (back end of line) layer formed on the active layer, an integrated waveguide formed, at least in part, in the bulk substrate layer, a first transmission line to waveguide transition, and a second transmission line to waveguide transition. A first integrated circuit of the semiconductor wafer is coupled to the integrated waveguide via the first transmission line to waveguide transition, and a second integrated circuit of the semiconductor wafer is coupled to the integrated waveguide via the second transmission line to waveguide transition. The first and second integrated circuits of the semiconductor wafer are configured to communicate by transmitting signals using the integrated waveguide.

Another embodiment of the invention includes a waveguide having a first metallic plate, a second metallic plate, metallic sidewalls connecting the first and second metallic plates, and a slotted feed to waveguide transition formed in an edge region of the first metallic plate. The slotted feed to waveguide transition includes first and second slots which are patterned adjacent to each other in the edge region of the first metallic plate, wherein first length portions of the first and second slots extend in parallel from an edge of the metallic plate, and wherein second length portions of the first and second slots extend at diverging angles from ends of the respective first length portions. A portion of the first metallic plate between the first and second slots provides a signal line connection to the slotted feed to waveguide transition, and portions of the first metallic plate on opposite sides of the first and second slots provide ground connections to the slotted feed to waveguide transition.

These and other embodiments of invention will be described or become apparent from the following detailed description of embodiments, which is to be read in connection with the accompanying drawings.

BRIEF DESCRIPTION OF THE DRAWINGS

FIG. 1B schematically illustrates a sidewall structure of the integrated waveguide structure of FIG. 1A, according to an embodiment of the invention.

FIG. 1C is a schematic cross-sectional view of the waveguide structure along line 1C-1C in FIG. 1B.

FIG. 8 is a schematic top plan view of a package structure according to another embodiment of the invention in which multiple integrated waveguides are utilized to provide multi-channel communications between IC chips.

FIGS. 9A and 9B schematically illustrate an integrated waveguide having a slotted feed to waveguide transition structure, according to an embodiment of the invention, wherein FIG. 9A is a schematic top plan view of the integrated waveguide and the slotted feed to waveguide transition structure, and FIG. 9B is a schematic side view of the integrated waveguide structure 900 along line 9B-9B in FIG. 9A.

DETAILED DESCRIPTION

Embodiments of the invention will now be discussed in further detail with regard to package structures having integrated waveguides that are configured to enable high data rate communication between package components (e.g., data rates in the range of Gbps to hundreds of Gbps) for use in systems having operating frequencies in the range of millimeter-wave frequencies to Terahertz frequencies and higher, for example. It is to be understood that the various layers and/or components shown in the accompanying drawings are not drawn to scale, and that one or more layers and/or components of a type commonly used in constructing semiconductor package structures with integrated circuit chips may not be explicitly shown in a given drawing. This does not imply that the layers and/or components not explicitly shown are omitted from the actual package structures. Moreover, the same or similar reference numbers used throughout the drawings are used to denote the same or similar features, elements, or structures, and thus, a detailed explanation of the same or similar features, elements, or structures will not be repeated for each of the drawings.

Figure 1A:
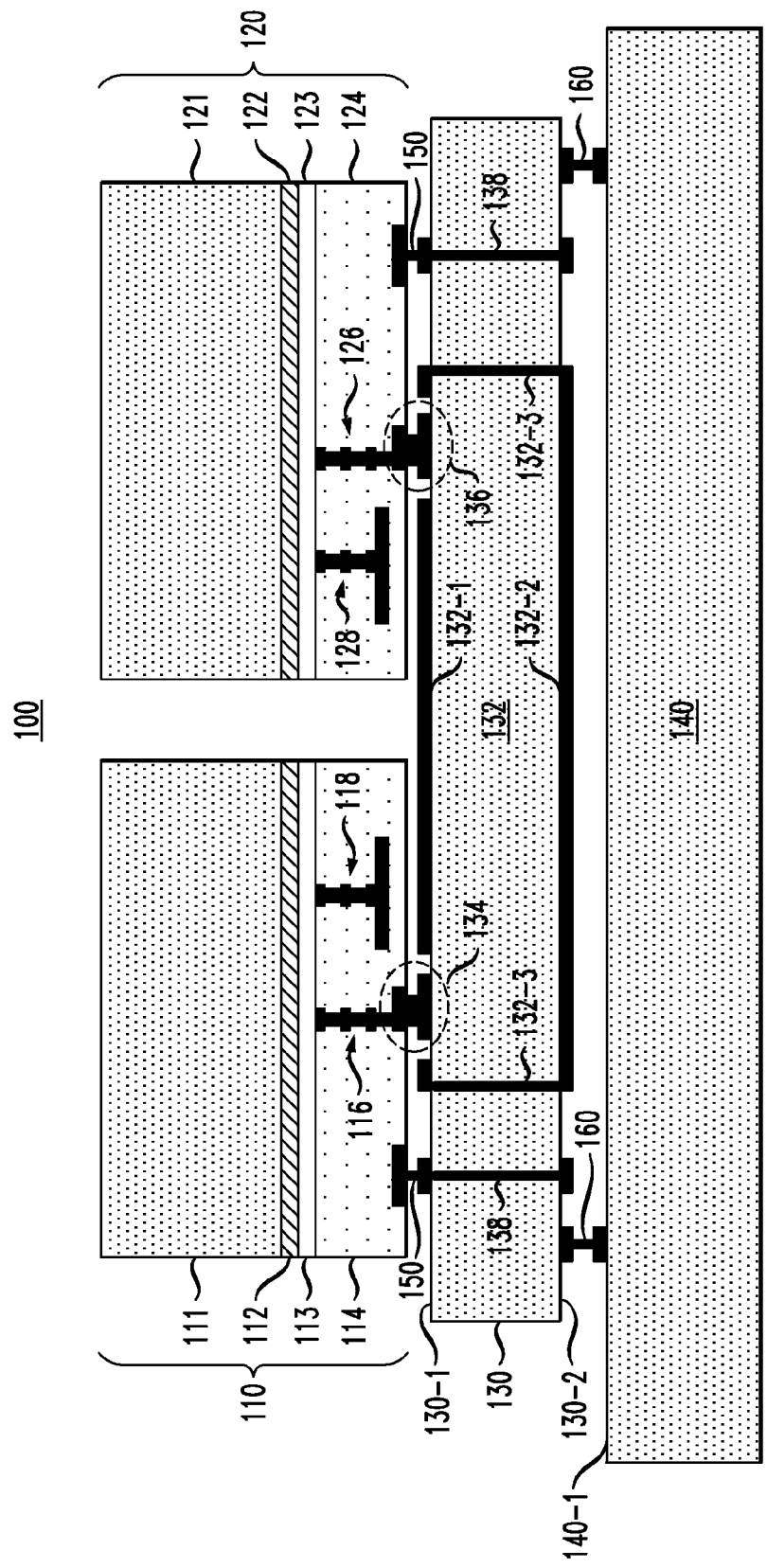
FIG. 1A is schematic cross-sectional side view of a package structure having an integrated waveguide according to an embodiment of the invention.

FIG. 1A schematically illustrates a package structure having an integrated waveguide according to an embodiment of the invention. In particular, FIG. 1A is a schematic cross-sectional side view of a package structure 100 comprising a first IC chip 110, a second IC chip 120, a waveguide substrate 130, and an application board 140. The first IC chip 110 comprises a bulk substrate layer 111, an insulating layer 112, an active layer 113, and a BEOL (back-end-of-line) structure 114. Similarly, the second IC chip 120 comprises a bulk substrate layer 121, an insulating layer 122, an active layer 123, and a BEOL structure 124. In one embodiment of the invention, the first and second IC chips are SOI (silicon-on-insulator) structures, wherein the insulating layers 112 and 122 are buried oxide layers formed on bulk silicon substrates, and wherein the active layers 113 and 123 are thin layers of silicon formed on the buried oxide layers, wherein active devices are formed in the active silicon layers 113 and 123.

In particular, the first and second IC chips 110 and 120 comprise active circuitry and electronic components formed in the respective active silicon layers 113 and 123, wherein the types of circuits and electronic components that are implemented will depend on the given application. For example, for RF (radio frequency) applications, RFIC circuitry and electronic components are formed in the active silicon layers 113 and 123, including, for example, receivers, transmitters or transceiver circuits, and other active or passive circuit elements that are commonly used to implement RFIC chips.

The BEOL structures 114 and 124 of the respective IC chips 110 and 120 comprise respective transmission lines 116 and 126, and other interconnect structures 118 and 128 that comprise a series of interconnected metallic traces and conductive vias which are formed within various alternating conductive and insulating/dielectric layers of the BEOL structures 114 and 124. The BEOL structures 114 and 124 of the respective first and second IC chips provide a network of interconnects to connection active circuitry and other components formed in the respective active layers 113 and 123. Furthermore, the BEOL structures 114 and 124 each comprise a plurality of bonding/contact pads such as, for example, ground pads, DC power supply pads, input/output pads, control signal pads, associated wiring, etc., that are formed as part of a BEOL wiring structure of the respective IC chips 110 and 120.

As shown in FIG. 1A, the first and second IC chips 110 and 120 are electrically and mechanically connected to the waveguide substrate 130 by flip-chip mounting the active (front side) surface of the first and second IC chips 110 and 120 to a first surface 130-1 of the waveguide substrate 130 using, for example, an array of solder ball controlled collapse chip connections (C4) 150, or other similar techniques. The C4 connections 150 are formed between bonding/contact pads and wiring patterns formed on a bottom surface of the BEOL structures 114 and 124, and corresponding bonding/contact pads and wiring patterns of a patterned metallization layer formed on the first surface 130-1 of the waveguide substrate 130.

Moreover, the waveguide substrate 130 is electrically and mechanically connected to the application board 140 using, for example, an array of BGA connections 160 or other similar techniques. The BGA connections 160 are formed between bonding/contact pads and wiring patterns of a patterned metallization layer formed on a second surface 130-2 of the waveguide substrate 130, and corresponding bonding/contact pads and wiring patterns of a patterned metallization layer formed on a surface 140-1 of the application board 140.

As further shown in FIG. 1A, the waveguide substrate 130 comprises an integrated waveguide 132. The integrated waveguide 132 comprises a first metallic plate 132-1, a second metallic plate 132-2, and sidewalls 132-3. The first and second metallic plates 132-1 and 132-3 are patterned from metallization layers on opposing surfaces 130-1 and 130-2 of the waveguide substrate 130, and the sidewalls 132-3 comprise an array of metallic posts (e.g., metallized via holes) connecting the first and second metallic plates 132-1 and 132-2.

FIG. 1B schematically illustrates a sidewall structure of the integrated waveguide 132 of FIG. 1A, according to an embodiment of the invention. In particular, FIG. 1B illustrates a sidewall structure along a length L of the integrated waveguide 132 (the length L corresponds to a direction of wave propagation in the integrated waveguide), wherein the sidewall structure comprises a series of metallic posts 132-3 that are formed with a spacing S between the metallic posts 132-3. In one embodiment of the invention, the metallic posts 132-2 are formed by drilling or etching an array of via holes through the waveguide substrate 130 and then plating or otherwise filling the via holes with metallic material such as copper.

Referring again to FIG. 1A, the package structure 100 further comprises a first transmission line to waveguide transition 134 and a second transmission line to waveguide transition 136. The first transmission line to waveguide transition 134 is connected to the transmission line 116 in the BEOL structure 114 of the first IC chip 110, and the second transmission line to waveguide transition 136 is connected to the transmission line 126 in the BEOL structure 214 of the second IC chip 120. The transmission line to waveguide transitions 134 and 136 are formed, in part, by transition structures that are formed/patterned in the first metallic plate 132-1 of the integrated waveguide 132.

The transmission lines 116 and 126 are formed from a series of interconnected wiring traces and conductive vias formed in the BEOL layers 114 and 124. The transmission lines 116 and 126 serve to transmit high frequency signals between the integrated waveguide 132 and active circuitry in the active layers 113 and 123 of the first and second IC chips 110 and 120. For high frequency applications, lateral extending portions of the transmission lines 116 and 126 may be formed by grounded planar transmission lines such as striplines or coplanar waveguide transmission lines to reduce coupling effects between the transmission lines 116 and 126 and surrounding components such as power plane, low frequency control signal lines, and other transmission lines.

For example, a stripline transmission line comprises a signal line formed on one metallization level, which is disposed between two ground elements formed by ground planes of adjacent metallization levels. Moreover, vertical portions of the transmission lines 116 and 126 can include vertical signal lines (e.g., formed by a series of connected vertical vias through multiple layers of the BEOL structures 114 and 124), wherein the vertical signal lines are shielded by series of grounding vias that surround the vertical signal line. In this regard, vertical portions of the transmission lines 116 and 126 are similar in structure and function to a coaxial transmission line.

The first and second transmission line to waveguide transitions 134 and 136 can be implemented using one of various types of known transmission line to waveguide transition structures that are sufficient to provide a transition between the transmission lines 116 and 126 and the I/O ports of the integrated waveguide 132. Such transmission line to waveguide transition structures include, for example, microstrip, stripline, coplanar waveguide, slotted feed, and probe-type transition structures, or other types of GSG (ground signal ground) transition structures, which are suitable for the intended application.

The integrated waveguide 132 provides a communication channel that allows the first and second IC chips 110 and 120 to communicate at high-speed data rates (e.g., data rates in the range of Gbps to hundreds of Gbps). Although one integrated waveguide structure is shown in FIG. 1A, the waveguide substrate 130 can be fabricated with two or more integrated waveguide structures to enable high-speed multi-channel communication between the first and second IC chips 110 and 120. Moreover, although two IC chips are shown in FIG. 1A connected to the waveguide substrate 130, the package structure 100 can have three or more IC chips flip-chip bonded to the waveguide substrate 130 with multiple integrated waveguide structures implemented in the waveguide substrate 130 to enable communication between all IC chips in the package structure 100.

As further shown in FIG. 1A, the waveguide substrate 130 comprises a plurality of conductive through vias 138 which provide electrical connections between contact pads and wiring patterns on the first and second surfaces 130-1 and 130-2 of the waveguide substrate. The conductive through vias 138 form part of the electrical wiring and interconnects that are utilized for supplying/distributing DC power to the IC chips 110 and 120 from power supply lines on the application board 140, and for routing low frequency base band and control signals, for example, between the application board 140 and the IC chips 110 and 120. Moreover, wiring patterns can be formed on the surface 130-1 of the waveguide substrate 130 and bonded to contact pads on the bottom surfaces of the BEOL structures 114 and 124 to enable low frequency communication between the first and second IC chips 110 and 120.

In this regard, it is to be appreciated that the waveguide substrate 130 serves multiple purposes. For example, the waveguide substrate 130 serves as a package substrate for mounting and supporting the IC chips 110 and 120. In addition, the waveguide substrate 130 serves as a package interposer for routing low frequency signals between the application board 140 and the IC chips 110 and 120, for routing low frequency signals between the IC chips 110 and 120, and for supplying power to IC chips 110 and 120. Moreover, the waveguide substrate 130 comprises one or more integrated waveguide structures that enables low-loss, high-speed data communications between the IC chips mounted on the waveguide substrate 130, as well as wiring patterns on.

The operating characteristics of the integrated waveguide 132 depends on various factors. For example, for low-loss transmission of high-speed communication signals, the waveguide substrate 130 should be fabricated using low loss insulating/dielectric material. For example, the waveguide substrate 130 can be formed of material such as glass (e.g., quartz) or high resistivity silicon, or other low loss materials that are suitable for the given package application. Moreover, the types of transmission line to waveguide transition structures that are implemented will have some effect on the amount of insertion loss and the operating bandwidth of the integrated waveguide, as is understood by one of ordinary skill in the art.

Moreover, various dimensional parameters such as the spacing S between the metallic posts 132-3 forming the waveguide sidewalls and the cross-sectional dimensions (height H as shown in FIGS. 1B and 1C, and width W as shown in FIG. 1C) of the integrated waveguide will depend on the desired operating frequency and bandwidth of and an integrated waveguide structure. For example, as shown in FIG. 1B, the spacing S between the metallic posts 132-3 should be small enough so that the sidewalls of the integrated waveguide 132 effectively provide a "closed structure" in conjunction with the metallic plates 132-1 and 132-2. For example, in one embodiment of the invention, the spacing S between the metallic posts 132-3 is less than about ¼ of the operating wavelength (S≤0.25 λ) of the integrated waveguide 132.

FIG. 1C is a cross-sectional view of the waveguide structure along line 1C-1C in FIG. 1B. FIG. 1C shows the cross-sectional dimensions of the integrated waveguide structure 132 including the height H between the first and second metallic plates 132-1 and 132-2 (i.e., the thickness of the waveguide substrate 130), and the waveguide width W between the opposing waveguide sidewalls 132-3. The operating modes of the integrated waveguide 132 are based on the dimensions H and W. In one embodiment, the width W is preferably much greater than 2×H for the integrated waveguide (which is to be contrasted with standard rectangular waveguides in which W=2×H). The width W is approximately one-half (½) the operating wavelength of the integrated waveguide 132. In this regard, the width W is a critical dimension that has a significant influence on the operating frequency of the waveguide. While the waveguide height H has some influence on the operating frequency, the height H primarily affects the loss of the waveguide structure. If the waveguide height H is too small, the insertion loss of the integrated waveguide increases.

Although not specifically shown in FIG. 1A, the first and second metallic plates 132-1 and 132-2 and sidewalls 132-3 are grounded through grounding connections between the components of the integrated waveguide 132 and the IC chips 110, 120 and/or the application board 140. For example, in one embodiment of the invention, the second metallic plate 132-2 may be a package ground plane. In this regard, the laminated waveguide 132 provides an electrically isolated structure in which the propagating signals within the integrated waveguide 132 (propagating along the waveguide length L) are electrically isolated from external electrical signals. The electrical isolation allows two integrated waveguide structures to be disposed in parallel to each other at close proximity (e.g., small pitch) without interference between the propagating signals in the adjacent integrated waveguides. In fact, as will be explained in further detail below, two adjacent integrated waveguides can be constructed with a common sidewall structure that is shared between the two adjacent integrated waveguides, while providing sufficient isolation between propagating signals in the adjacent waveguides.

Figure 2:
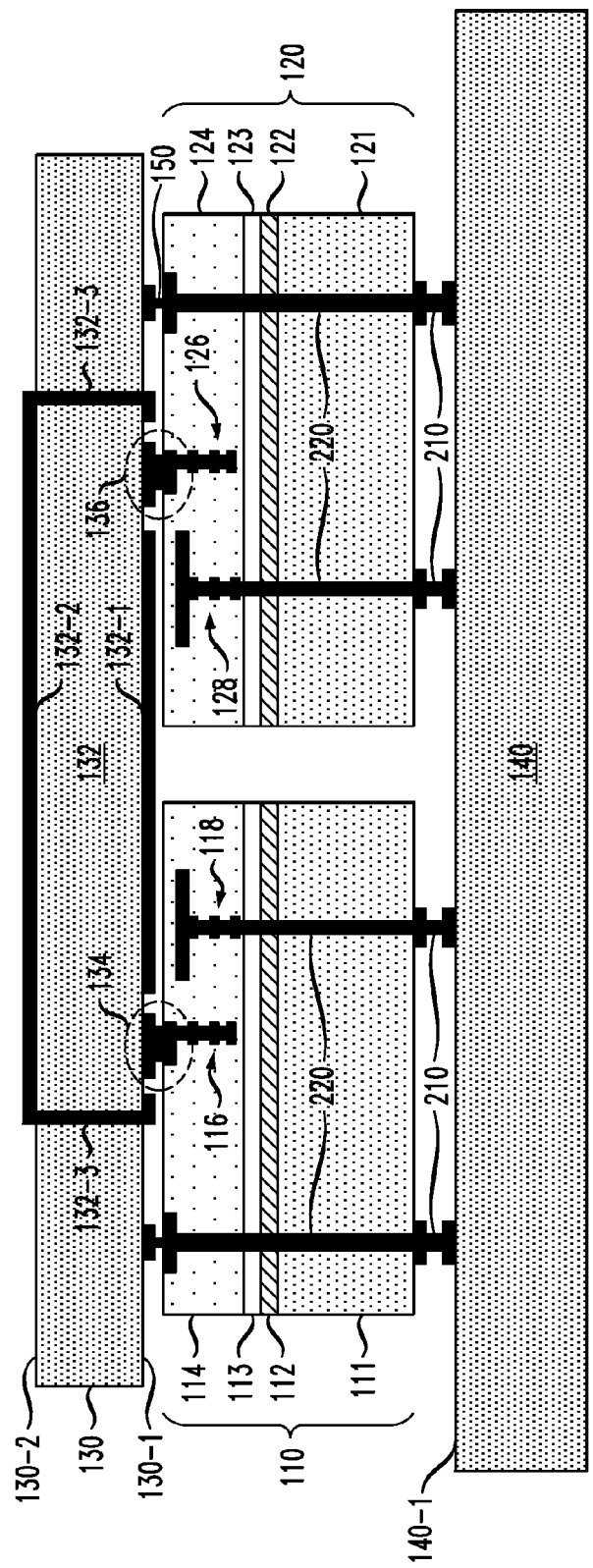
FIG. 2 is schematic cross-sectional side view of a package structure having an integrated waveguide according to another embodiment of the invention.

FIG. 2 schematically illustrates a package structure having an integrated waveguide according to another embodiment of the invention. In particular, FIG. 2 is a schematic cross-sectional side view of a package structure 200 which is similar to the package structure 100 of FIG. 1A, but wherein a backside of the first and second IC chips 110 and 112 are connected to the application board 140 using a plurality of micro bump connections 210 (e.g., C4 connections). As further shown in FIG. 2, a plurality of through-silicon vias 220 (TSVs) are formed through the bulk substrates 111 and 121 and electrically connected to metallization layers in the BEOL structures 114 and 124 of the first and second IC chips 110 and 120.

In this embodiment, the through-silicon vias 220 can be utilized to supply and distribute DC power to the IC chips 110 and 120 from power supply lines on the application board 140, and to route low frequency base band and control signals, for example, between the application board 140 and the IC chips 110 and 120. Furthermore, in one embodiment of the invention, the waveguide substrate 130 can have wiring patterns formed on the first surface 130-1 thereof to enable routing of low frequency signals between the IC chips 110 and 120.

Figure 3:
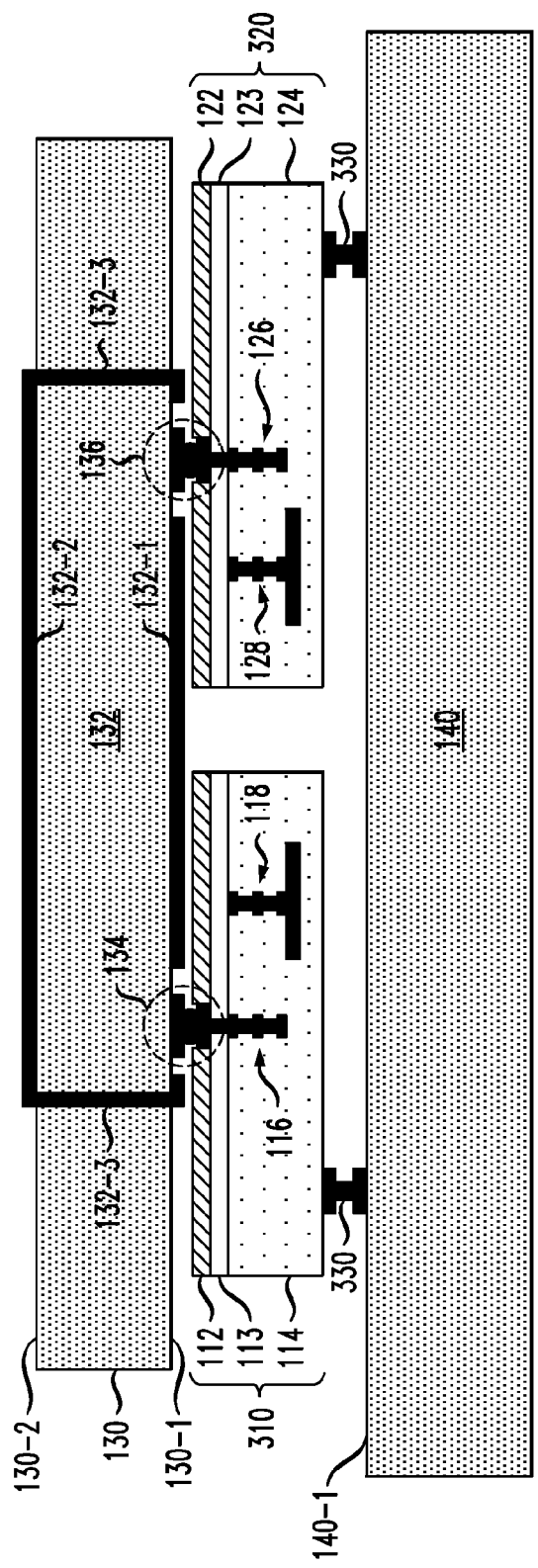
FIG. 3 is schematic cross-sectional side view of a package structure having an integrated waveguide according to another embodiment of the invention.

FIG. 3 schematically illustrates a package structure having an integrated waveguide according to yet another embodiment of the invention. In particular, FIG. 3 is a schematic cross-sectional side view of a package structure 300, which is similar to the package structures discussed above, but wherein first and second IC chips 310 and 320 are shown without the bulk substrates. In this embodiment, the backside of the first and second IC chips 310 and 320 are ground or otherwise etched to remove the bulk silicon down to the insulating layers 112 and 122 (e.g., buried oxide layers) before being mounted in the package.

The insulating layers 112 and 122 of the first and second IC chips 310 and 320 are bonded to the first surface 130-1 of waveguide substrate 130 using an adhesive material (e.g., epoxy adhesive). In addition, electrical connections are made between the IC chips 310 and 320 and the waveguide substrate 130 by, e.g., connecting end portions of the transmission lines 116 and 126 to the transmission line to waveguide transitions 134 and 136 using suitable micro joint connections. In this embodiment, a plurality of micro bump connections 330 (e.g., C4 connections) are utilized to supply and distribute DC power to the IC chips 310 and 320 from power supply lines formed on the surface 140-1 of the application board 140, and to route low frequency base band and control signals, for example, between the application board 140 and the IC chips 310 and 320.

Figure 4:
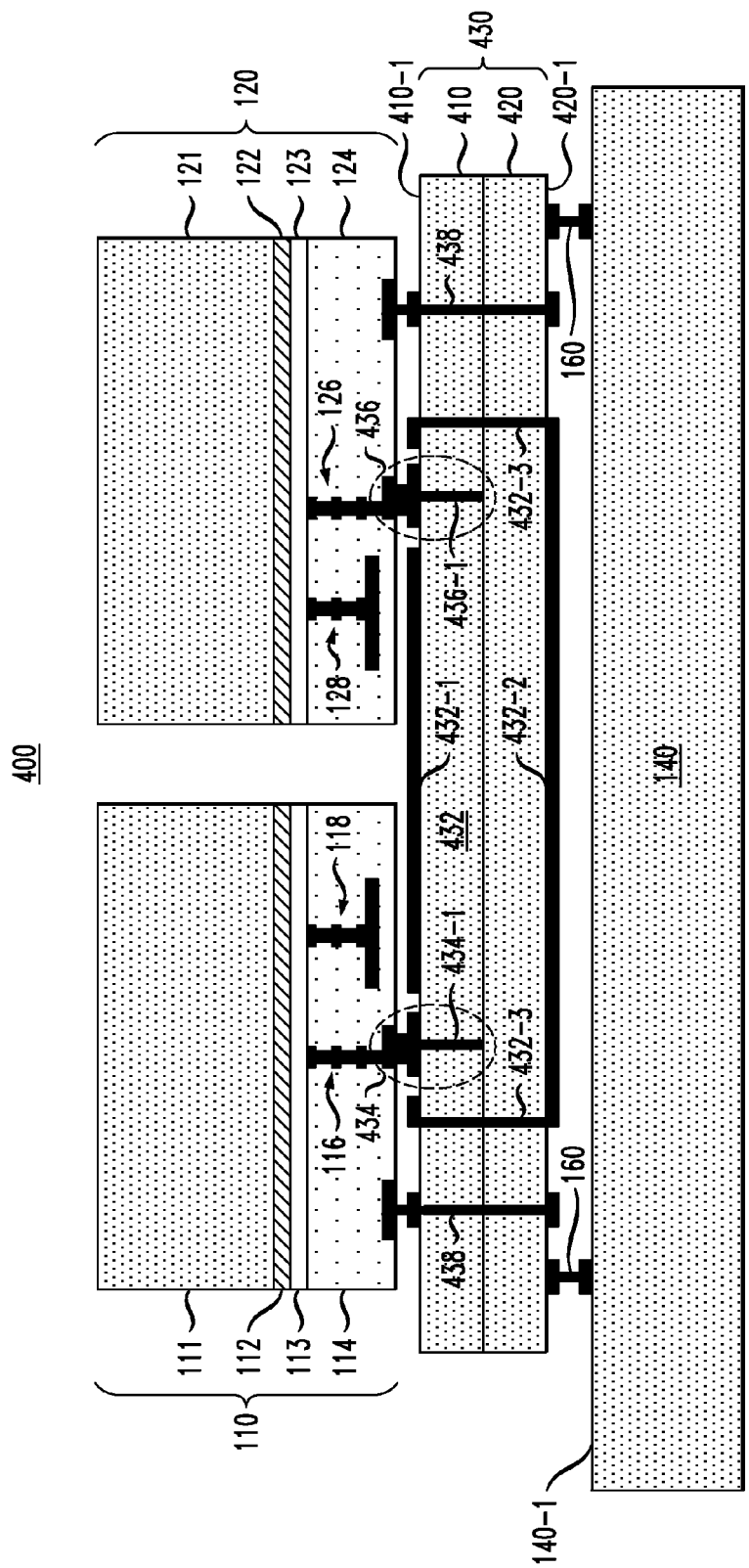
FIG. 4 is schematic cross-sectional side view of a package structure having an integrated waveguide according to another embodiment of the invention.

FIG. 4 schematically illustrates a package structure having an integrated waveguide according to another embodiment of the invention. In particular, FIG. 4 is a schematic cross-sectional side view of a package structure 400 which is similar to the package structure 100 of FIG. 1A, but wherein a waveguide substrate 430 is shown having a probe-fed integrated waveguide 432. In this embodiment, the waveguide substrate 430 comprises first substrate 410 and a second substrate 420, which are laminated to each other. The waveguide substrate 430 comprises a plurality of conductive through vias 438 which provide electrical connections between contact pads and wiring patterns on upper and lower surfaces 410-1 and 420-1 of the waveguide substrate 430. The probe-fed integrated waveguide 432 comprises a first metallic plate 432-1 formed on a surface of the first substrate 410, a second metallic plate 432-2 formed on a surface of the second substrate 420, and sidewalls 432-3 formed in the first and second substrates 410 and 420 connecting the first and second metallic plates 432-1 and 432-2.

The package 400 further comprises a first transmission line to waveguide transition structure 434 and a second transmission line to waveguide transition structure 436 having respective probe elements 434-1 and 436-1. In one embodiment of the invention, the probe elements 434-1 and 436-1 comprise buried conductive vias that are formed in the first substrate 410 before bonding the first and second substrates 410 and 420 together. For example, the probe elements 434-1 and 436-1 can be formed by drilling via holes through the first substrate 410 and then metallizing the via holes using a standard process (e.g., electroplating).

After forming the probe elements 434-1 and 436-1, the first and second substrates 410 and 420 are bonded together, and the metallization on the surfaces 410-1 and 420-1 of the first and second substrates 410 and 420 are patterned to form the metallic plates 432-1 and 432-2 (e.g., upper and lower waveguide walls) and other conductive structures (e.g., bonding pads, wiring, etc.). The sidewalls 432-3 of the integrated waveguide 432 can be formed after the first and second substrates 410 and 420 are bonded together by, e.g., forming via holes through the first and second substrates 410 and 420 (e.g., drilling, etching, laser ablation, etc.) and then metallizing the via holes to form the conductive sidewalls 432-3.

Figure 5:
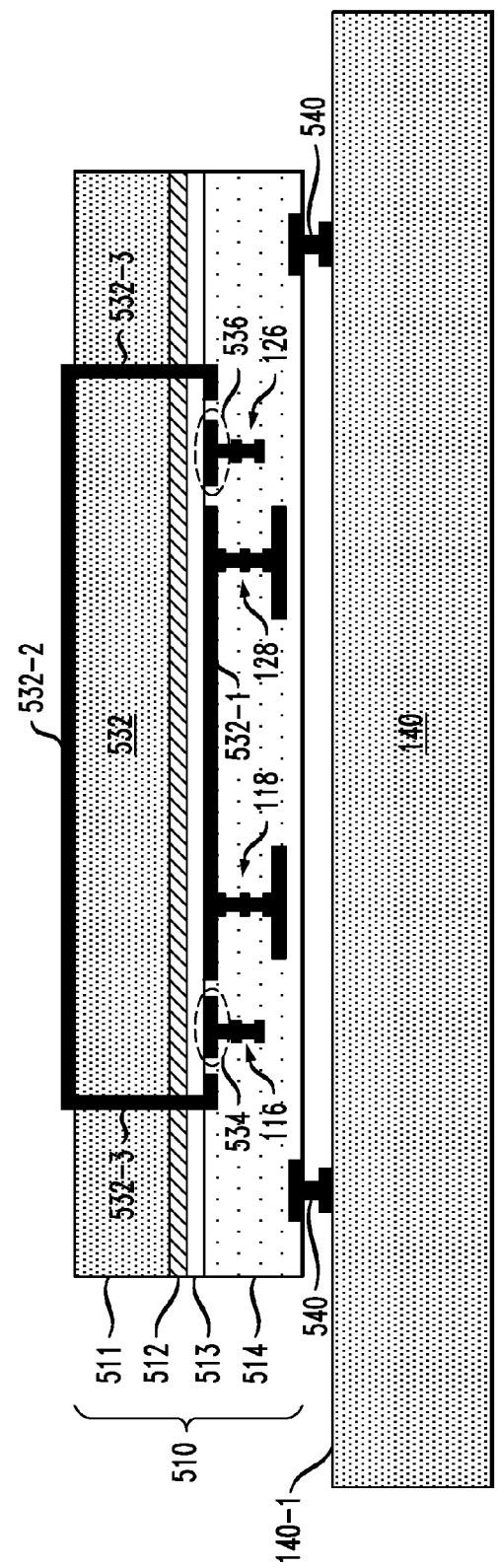
FIG. 5 is schematic cross-sectional side view of a package structure having an integrated waveguide according to another embodiment of the invention.

FIG. 5 schematically illustrates a package structure having an integrated waveguide according to yet another embodiment of the invention. In particular, FIG. 5 is a schematic cross-sectional side view of a package structure 500 comprising semiconductor wafer 510 (or a portion of a wafer) comprising a bulk substrate layer 511, an insulating layer 512, an active silicon layer 513, and a BEOL structure 514. In one embodiment of the invention, the semiconductor wafer 510 comprises a SOI (silicon-on-insulator) wafer, wherein the insulating layer 512 is a buried oxide layer formed on a bulk silicon substrate 511, and wherein the active layer 513 comprises a thin layer of silicon formed on the buried oxide layer, wherein active devices are formed in the active silicon layer 513. In one embodiment, the bulk silicon layer 511 is formed of high resistivity silicon to implement a low-loss embedded waveguide structure.

More specifically, as further shown in FIG. 5, the package structure 500 comprises an integrated waveguide 532 that is formed within the various layers of the semiconductor wafer 510. For example, a first metallic plate 532-1 and transmission line to waveguide transition structures 534 and 536 are formed from metallization layers in the BEOL layer 514. A second metallic plate 532-2 is formed from a patterned metallization layer on the backside of the bulk silicon substrate 511. A plurality of conductive through-silicon vias are formed through the bulk substrate 511, the insulating layer 512, and the active silicon layer 513 to form waveguide sidewalls 532-3.

In the embodiment of FIG. 5, a portion of the bulk substrate 511, the insulating layer 512, and the active layer 513 are contained inside the integrated waveguide 530. Since a majority of the material within the integrated waveguide 530 comprises a low loss material of the bulk substrate 511 (e.g., high resistivity silicon), the performance of the integrated waveguide 530 is not unduly effected by the presence of potentially lossy materials that are used to form the insulating layer 512 and the active silicon layer 513. In one embodiment, the first metallic plate 532-1 and portions of the transmission line to waveguide transition structures 534 and 536 are formed from a first metallization layer of the BEOL layer 514.

The integrated waveguide 532 provides a communication channel that allows active circuitry in different regions of the semiconductor wafer 510 (e.g., two different dies) to communicate at high-speed data rates (e.g., data rates in the range of Gbps to hundreds of Gbps). Although one integrated waveguide structure 532 is shown in FIG. 5, the semiconductor wafer 510 can be fabricated having two or more integrated waveguide structures to enable high-speed multi-channel communication between active circuitry in multiple regions of the semiconductor wafer 510 (e.g., three or more different dies), or to implement multiple channels of high speed communication between different die regions, for example.

As further shown in FIG. 5, the semiconductor wafer 510 is flip-chip mounted to the application board 140 using, for example, an array of C4 connections 540, or other similar micro bump techniques. The C4 connections 540 are formed between bonding/contact pads and wiring patterns that are part of the BEOL layer 514 and corresponding bonding/contact pads and wiring patterns of a patterned metallization layer formed on the surface 140-1 of the application board 140.

Figure 6:
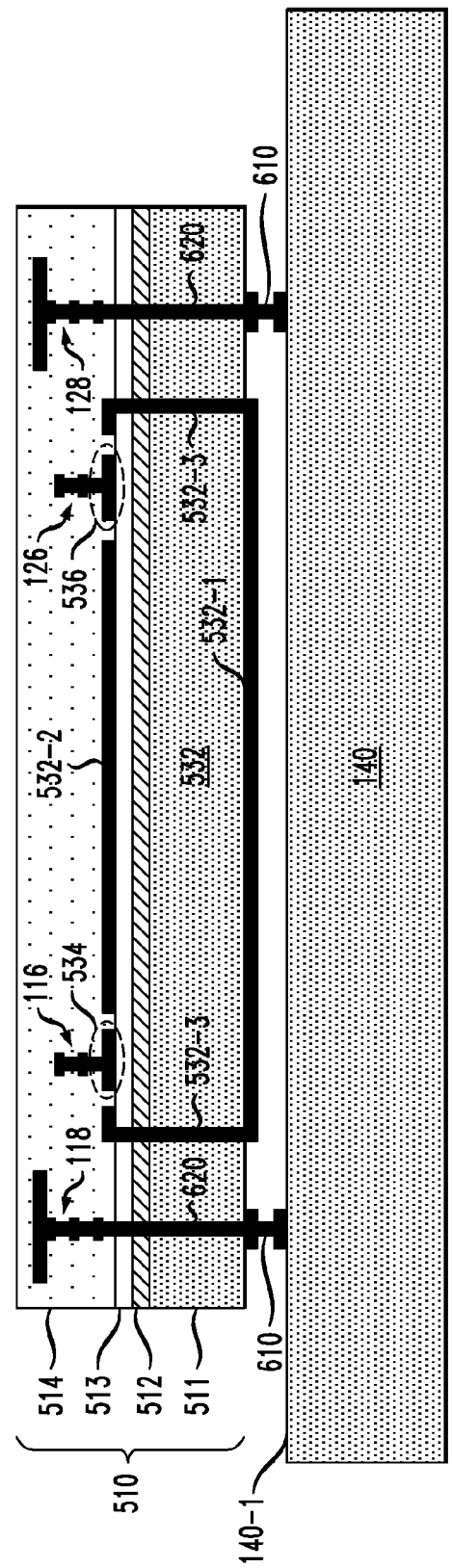
FIG. 6 is schematic cross-sectional side view of a package structure having an integrated waveguide according to another embodiment of the invention.

FIG. 6 schematically illustrates a package structure having an integrated waveguide according to another embodiment of the invention. In particular, FIG. 6 is a schematic cross-sectional side view of a package structure 600 which is similar to the package structure 500 of FIG. 5, but wherein a backside of the semiconductor wafer 510 is connected to the application board 140 using a plurality of micro bump connections 610 (e.g., C4 connections). As further shown in FIG. 6, a plurality of conductive through-silicon vias 620 are formed through the bulk substrate layer 511 of the semiconductor wafer 510 to form electrical connections between metallization layers in the BEOL structure 514 and bonding pads and wiring on the surface 140-1 of the application board 140. For example, in one embodiment, the conductive through-silicon vias 620 are utilized to supply and distribute DC power to circuitry in different regions (e.g., different dies) of the semiconductor wafer 510 from power supply lines on the surface 140-1 of the application board 140, and to route low frequency base band and control signals, for example, between the application board 140 and active circuitry of the semiconductor wafer 510.

Figure 7:
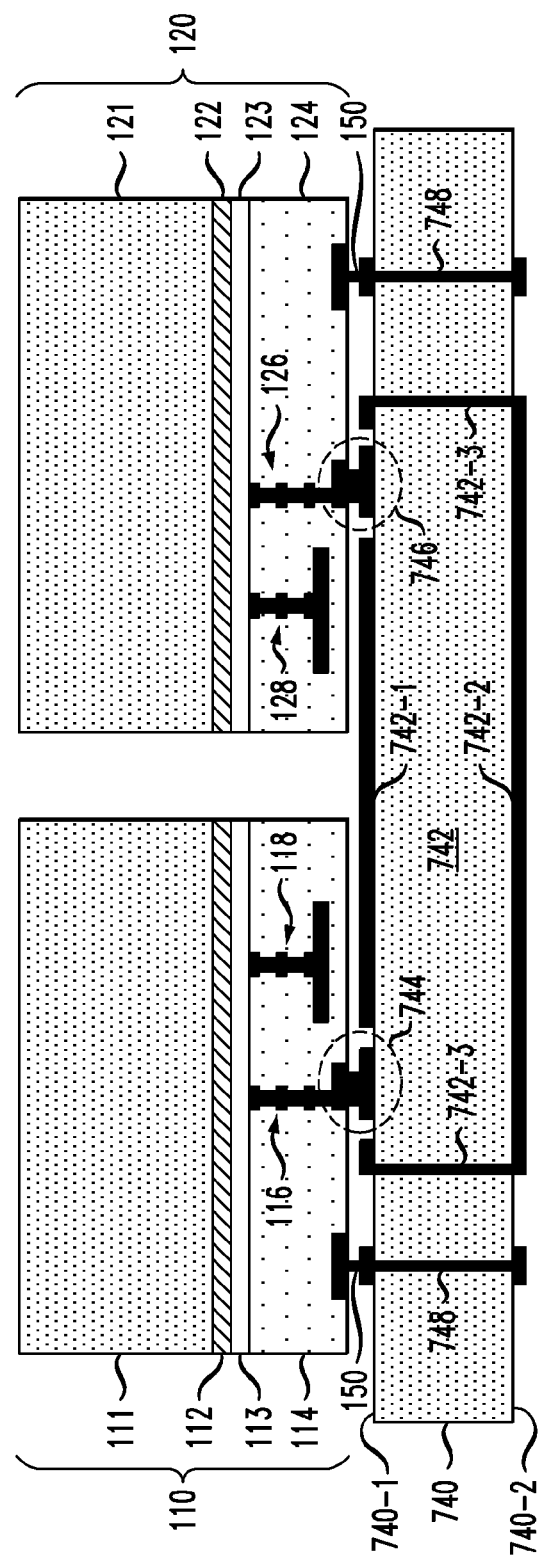
FIG. 7 is schematic cross-sectional side view of a package structure having an integrated waveguide according to another embodiment of the invention.

FIG. 7 schematically illustrates a package structure having an integrated waveguide according to yet another embodiment of the invention. In particular, FIG. 7 is a schematic cross-sectional side view of a package structure 700 which is similar to the package structure 100 of FIG. 1, but wherein the waveguide substrate 130 of FIG. 1 is eliminated, and wherein an application board 740 is constructed having an integrated waveguide 742. As shown in FIG. 7, the first and second IC chips 110 and 120 are electrically and mechanically flip-chip mounted to a surface 740-1 of the application board 740 using an array of C4 connections 150, or other similar micro bump techniques.

The integrated waveguide 742 comprises a first metallic plate 742-1, a second metallic plate 742-2, and sidewalls 742-3. The first and second metallic plates 742-1 and 742-2 are patterned from metallization layers on opposing surfaces 740-1 and 740-2 of the application board 740, and the sidewalls 742-3 are formed by metallic posts (e.g., conductive vias) formed through the application board 740. Moreover, the package structure 700 comprises transmission line to waveguide transition structures 744 and 746, wherein at least a portion of the transmission line to waveguide transition structures 744 and 746 have structures that are formed from patterning the metallization layer on the first side 740-1 of the application board. In one embodiment, the application board 740 is formed of low loss material to enhance the operating characteristics of the integrated waveguide 742 at high operating frequencies.

As further shown in FIG. 7, the application board 740 comprises a plurality of conductive through vias 748, which provide electrical connections between contact pads and wiring patterns on the first and second surfaces 740-1 and 740-2 of the application board 740. The conductive through vias 748 form part of the electrical wiring and interconnects that are utilized for supplying/distributing DC power to the IC chips 110 and 120 from power supply lines on the application board 740, and for routing low frequency base band and control signals, for example, between the application board 740 and the IC chips 110 and 120 and for routing low frequency signals between the IC chips 110 and 120.

FIG. 8 schematically illustrates a package structure according to another embodiment of the invention in which multiple integrated waveguides are utilized to provide multi-channel communications between IC chips. More specifically, FIG. 8 is a schematic top plan view of a package structure 800 comprising a first IC chip 810 and a second IC chip 820, which are flip-chip mounted on a package carrier 830 using a plurality of bonding pads 811 and 821, respectively. In one embodiment of the invention, the package carrier 830 may be a dedicated waveguide substrate (as in the example embodiments of FIGS. 1, 2, 3 and 4, for example) or an application board (as in the example embodiment of FIG. 7), or some other type of package carrier.

The package carrier 830 comprises a plurality of integrated waveguide structures 831, 832 and 833, each comprising a transmission line to waveguide transition 834 to connect to transmission lines of the first IC chip 810, and transmission line to waveguide transition structures 835 to connect to transmission lines of the second IC chip 820. In the example embodiment shown in FIG. 8, the transmission line to waveguide transition structures 834 and 835 comprise microstrip to waveguide transition structures. The microstrip to waveguide transition structures can be formed using conventional techniques and structures.

In the example embodiment of FIG. 8, the package structure 800 provides three high data rate communication channels between the first and second IC chips 810 and 820 using the three separate integrated waveguides 831, 832, and 833. Moreover, because the integrated waveguide structures are electrically isolated with little mutual coupling to external components, the two adjacent waveguides 832 and 833 as shown in FIG. 8 can be constructed to share a common sidewall structure 836, which is formed by a series of metallic posts, as discussed above. This enables high-density integration of multiple embedded waveguide structures within a highly integrated package structure.

Figure 9A:
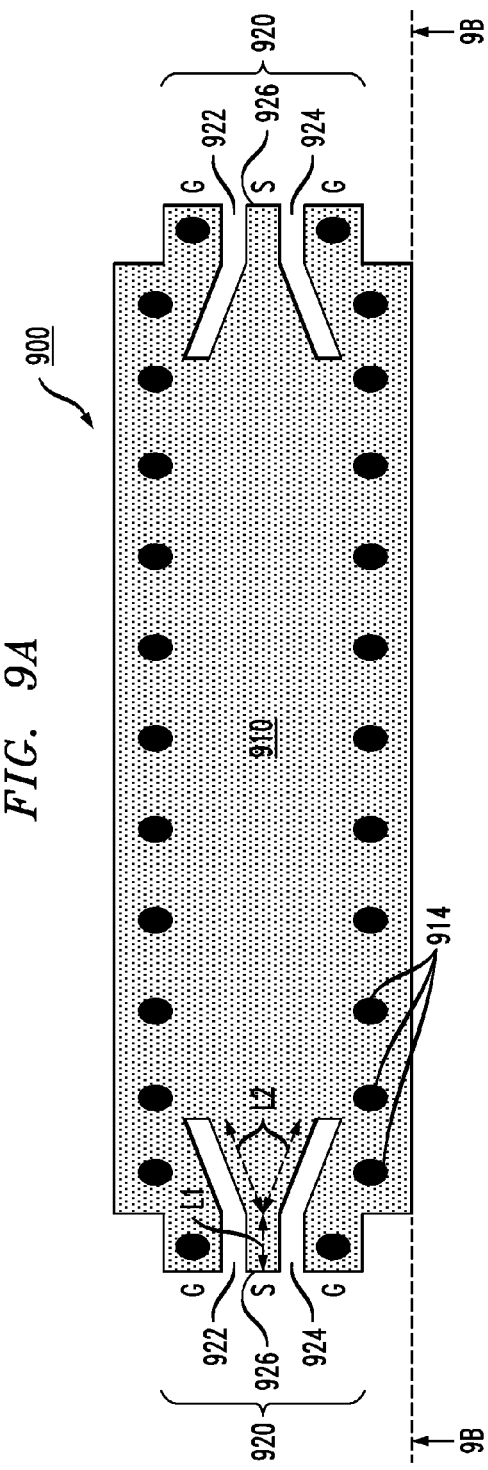
Figure 9B:
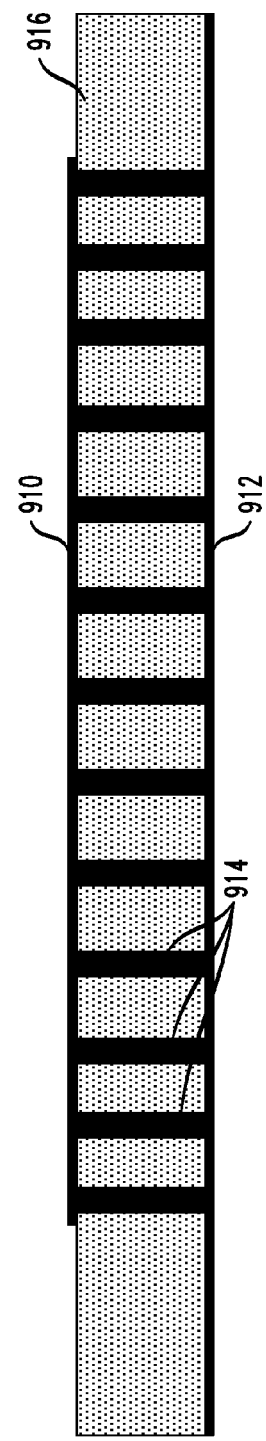

FIGS. 9A and 9B schematically illustrate an integrated waveguide 900 having a slotted feed to waveguide transition structure 920, according to an embodiment of the invention. In particular, FIG. 9A is a schematic top plan view of the integrated waveguide 900 and the slotted feed to waveguide transition structure 920, and FIG. 9B is a schematic side view of the integrated waveguide structure 900 along line 9B-9B in FIG. 9A. As shown in FIGS. 9A and 9B, the integrated waveguide 900 comprises a first metallic plate 910, a second metallic plate 912 (FIG. 9B), and sidewalls that are formed by a series of metallic posts 914 (e.g., metallized via holes) connecting the first and second metallic plates 910 and 912.

As shown in FIG. 9B, the first and second metallic plates 910 and 912 are formed from metallization on opposing surfaces of a substrate 916. In one embodiment, the substrate 916 is formed of a low loss material such as glass or high resistivity silicon, for example. In one embodiment of the invention, the second metallic plate 912 comprises, or is part of a package ground plane, and serves to electrically ground the metallic components of the integrated waveguide 900.

As shown in FIG. 9A, the slotted feed to waveguide transition 920 comprises a first slot 922 and a second slot 924, which are patterned adjacent to each other in an edge region of the first metallic plate 910 of the integrated waveguide 900. As shown in FIG. 9A, first length portions (L1) of the first and second slots 922 and 924 extend in parallel from an edge of the first metallic plate 910, and second length portions (L2) of the first and second slots 922 and 924 extend at diverging angles from ends of the respective first length portions (L1). In one embodiment of the invention, as shown in FIG. 9A, the first and second slots 922 and 924 are mirror image patterns, forming a Y-shaped slot structure.

The slotted feed to waveguide transition 920 provides a GSG (ground-signal-ground) connection to a planar transmission line, wherein a portion 926 (FIG. 9A) of the first metallic plate 910 between the first and second slots 922 and 924 provides a signal line (S) connection to the slotted feed to waveguide transition 920, and wherein portions of the first metallic plate 910 on opposite sides of the first and second slots 922 and 924 provide ground (G) connections to the slotted feed to waveguide transition 920. The exemplary transmission line to waveguide transition 920 shown in FIG. 9A provides wideband operation and is very flexible in that it can interface with CPW-type transmission lines as well as stripline and microstrip-type transmission lines. The transmission line to waveguide transition 920 can be readily implemented in package structures as discussed herein.

Figure 10:
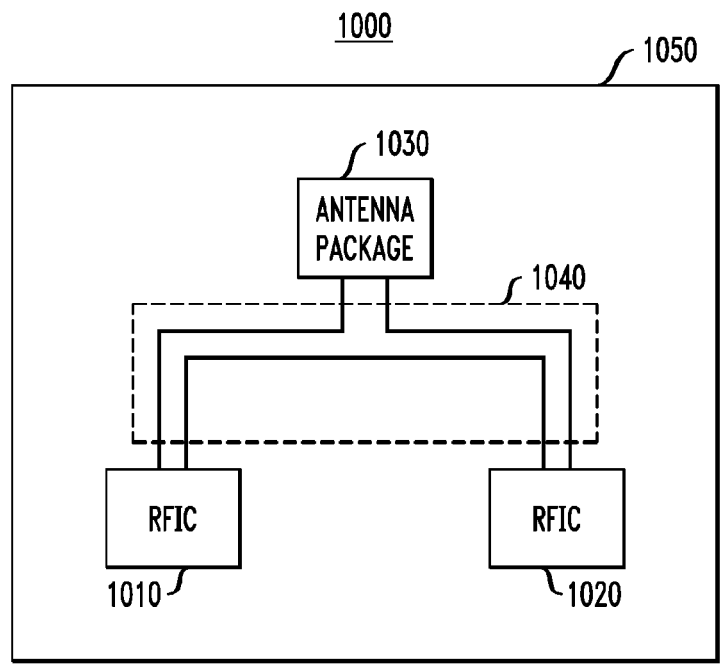
FIG. 10 is a schematic top plan view of a package structure according to another embodiment of the invention in which multiple integrated waveguides are utilized to implement an embedded power combiner/divider circuit.

FIG. 10 schematically illustrates a package structure according to another embodiment of the invention in which multiple integrated waveguides are utilized to implement an embedded power combiner/divider circuit for wireless applications. More specifically, FIG. 10 is a schematic top plan view of a package structure 1000 comprising a first RFIC (radio frequency integrated circuit) chip 1010, a second RFIC chip 1020, an antenna package 1030, and a passive power combiner and/or divider circuit 1040, which is implemented from a network of integrated waveguide structures integrally formed in a package carrier 1050. In another embodiment of the invention, elements 1010 and 1020 may be RFIC package structures comprising one or more RFIC chips.

In one embodiment of the invention, the first and second RFIC chips 1010 and 1020 and the antenna package 1030 are mounted to the package carrier 1050. The package carrier 1050 may be a dedicated waveguide substrate (as in the example embodiments of FIGS. 1, 2, 3 and 4, for example) or an application board (as in the example embodiment of FIG. 7), or some other type of package carrier. The power combiner and/or divider circuit 1040 allows the first and second RFIC chips 1010 and 1020 to send RF signals to the antenna package 1030 for transmission by one or more antennas of the antenna package 1030, and/or receive RF signals that are captured by the one or more antennas of the antenna package 1030 and transmitted to the first and second RFIC chips 1010 and 1020 from the antenna package 1030.

Figure 11:
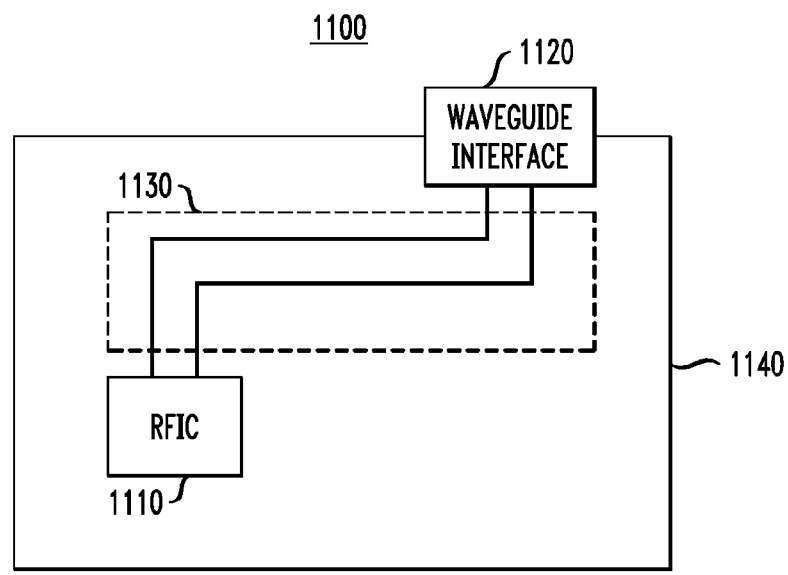
FIG. 11 is a schematic top plan view of a package structure having an integrated waveguide according to another embodiment of the invention.

FIG. 11 schematically illustrates a package structure having an integrated waveguide according to another embodiment of the invention. More specifically, FIG. 11 is a schematic top plan view of a package structure 1100 comprising an RFIC chip 1110 (or RFIC package), a waveguide interface 1120, and an integrated waveguide 1130 integrally formed in a package carrier 1040. The RFIC chip 1110 and waveguide interface 1120 are mounted to or otherwise formed on the package carrier 1140. The package carrier 1140 may be a dedicated waveguide substrate (as in the example embodiments of FIGS. 1, 2, 3 and 4, for example) or an application board (as in the example embodiment of FIG. 7), or some other type of package carrier. The integrated waveguide 1130 provides a communication channel between the RFIC chip 1110 and the waveguide interface 1120, wherein the waveguide interface 1120 is configured to be connectable to an external waveguide structure (e.g., metal waveguide or dielectric waveguide) that routes communication signals to and from a high gain antenna system, for example, to the package 1100.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A package structure, comprising:
   a package substrate comprising an integrated waveguide; and
   a first integrated circuit chip and a second integrated circuit chip mounted to the package substrate;
   wherein the first integrated circuit chip is coupled to the integrated waveguide using a first transmission line to waveguide transition;
   wherein the second integrated circuit chip is coupled to the integrated waveguide using a second transmission line to waveguide transition;
   wherein the first and second integrated circuit chips are configured to communicate by transmitting signals using the integrated waveguide of the package substrate; and
   wherein the package substrate comprises a high resistivity silicon substrate.

2. The package structure of claim 1, wherein the package substrate comprises:
   a planar substrate which comprises the high resistivity silicon substrate; and
   a first metallization layer and a second metallization layer formed on opposite surfaces of the planar substrate;
   wherein at least a portion of the first and second transmission line to waveguide transitions are formed from at least one of the first and second metallization layers; and
   wherein the integrated waveguide comprises:
     a first metallic plate patterned from the first metallization layer;
     a second metallic plate patterned from the second metallization layer; and
     sidewalls disposed between the first and second metallic plates;
     wherein the sidewalls comprise a series of conductive vias that are formed through the planar substrate connecting the first and second metallic plates.

3. The package structure of claim 2, wherein the planar substrate comprises at least a first substrate and a second substrate which are bonded together, wherein the first substrate comprise a first probe element that forms part of the first transmission line to waveguide transition, and a second probe element that forms part of the second transmission line to waveguide transition, wherein the first and second probe elements comprise conductive buried vias formed in the first substrate.

4. The package structure of claim 2, wherein at least one of the first metallic plate and the second metallic plate of the integrated waveguide comprises a around plane of the package structure.

5. The package structure of claim 2, wherein a spacing S between the conductive vias that form the sidewalls of the integrated waveguide is less than or equal to about one-quarter (¼) of an operating wavelength of the integrated waveguide.

6. The package structure of claim 2, wherein a height H of the integrated waveguide is defined by a thickness of the planar substrate of the integrated waveguide between the first and second metallic plates, wherein a width W of the integrated waveguide is defined by a distance between opposing sidewalls of the integrated waveguide device, and wherein the width W is greater than 2×H.

7. The package structure of claim 6, wherein the width W is approximately one-half (½) an operating wavelength of the integrated waveguide.

8. The package structure of claim 1, further comprising an application board;
   wherein the first and second integrated circuit chips each comprise a silicon-on-insulator (SOI) substrate, wherein the SOT substrate comprises a BEOL (back end of line structure), an active silicon layer, and a buried oxide layer;
   wherein the buried oxide layers of the first and second integrated circuit chips are bonded to the package substrate comprising the integrated waveguide;
   wherein the application board is mounted to the BEOL structures of the first and second integrated circuit chips, such that the first and second integrated circuit chips are disposed between the application board and the package substrate; and
   wherein at least a portion of the first and second transmission line to waveguide transitions comprise metallization structures that are formed in regions of the active silicon and buried oxide layers.

9. The package structure of claim 1, further comprising an application board;
   wherein active surfaces of the first and second integrated circuit chips are mounted to the package substrate comprising the integrated waveguide;
   wherein the application board is mounted to inactive surfaces of the first and second integrated circuit chips, such that the first and second integrated circuit chips are disposed between the application board and the package substrate; and
   wherein the first and second integrated circuit chips comprise through-silicon vias that are formed in bulk substrate layers of the first and second integrated circuit chips, wherein the through-silicon vias provide electrical connections between the application board and BEOL (back end of line) structures of the first and second integrated circuit chips.

10. The package structure of claim 1, further comprising an antenna package mounted to the package substrate, wherein the package substrate comprises an integrated power combiner structure connecting the antenna package and the first and second integrated circuit chips, wherein the integrated power combiner comprises further integrated waveguide structures integrally formed in the package substrate.

11. The package structure of claim 1, further comprising an antenna package mounted to the package substrate, wherein the package substrate comprises an integrated power divider structure connecting the antenna package and the first and second integrated circuit chips, wherein the integrated power divider comprises further integrated waveguide structures integrally formed in the package substrate.

12. The package structure of claim 1, further comprising a waveguide interface connected to the package substrate, wherein the waveguide interface is configured to couple to a metallic waveguide or a dielectric waveguide, wherein the package substrate comprises a second integrated waveguide connecting the waveguide interface to at least one of the first and second integrated circuit chips.

13. The package structure of claim 1, wherein the first and second transmission line to waveguide transitions comprise one of a microstrip to waveguide transition, a coplanar waveguide to waveguide transition, a stripline to waveguide transition, and a slotted feed to waveguide transition.

14. The package structure of claim 1, wherein at least one of the first and second transmission line to waveguide transitions comprises a slotted feed to waveguide transition, wherein the slotted feed to waveguide transition comprises:
   first and second slots patterned adjacent to each other in an edge region of a first metallic plate of the integrated waveguide;
   wherein first length portions of the first and second slots extend in parallel from an edge of the first metallic plate;
   wherein second length portions of the first and second slots extend at diverging angles from ends of the respective first length portions;
   wherein a portion of the first metallic plate between the first and second slots provides a signal line connection to the slotted feed to waveguide transition; and
   wherein portions of the first metallic plate on opposite sides of the first and second slots provide ground connections to the slotted feed to waveguide transition.

15. A package structure, comprising:
   a package substrate comprising an integrated waveguide;
   a first integrated circuit chip and a second integrated circuit chip mounted to the package substrate; and
   an application board;
   wherein the first integrated circuit chip is coupled to the integrated waveguide using a first transmission line to waveguide transition;
   wherein the second integrated circuit chip is coupled to the integrated waveguide using a second transmission line to waveguide transition;
   wherein the first and second integrated circuit chips are configured to communicate by transmitting signals using the integrated waveguide of the package substrate;
   wherein the package substrate comprising the integrated waveguide is mounted to the application board such that the package substrate serves as an interposer between the application board and the first and second integrated circuit chips;
   wherein the package substrate comprises a plurality of conductive vias formed through the package substrate, and wiring patterns formed on surfaces of the package substrate; and wherein the conductive vias and the wiring patterns of the package substrate are configured to route low frequency signals between the first and second integrated circuit chips and between the application board and the first and second integrated circuit chips, and to distribute DC power from the application board to the first and second integrated circuit chips.

* * * * *